United States Patent
Foong et al.

(10) Patent No.: US 10,826,217 B2
(45) Date of Patent: Nov. 3, 2020

(54) HORIZONTAL CLAMP ELECTRICAL CONTACT ASSEMBLY

(71) Applicant: JF MICROTECHNOLOGY SDN. BHD., Petaling Jaya, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY); Muhamad Izzat bin Roslee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 0 days.

(21) Appl. No.: 16/287,834

(22) Filed: Feb. 27, 2019

(65) Prior Publication Data
US 2019/0267738 A1  Aug. 29, 2019

(30) Foreign Application Priority Data
Feb. 27, 2018 (MY) .......................... PI 2018700785

(51) Int. Cl.
| H01R 13/11 | (2006.01) |
| G01R 31/28 | (2006.01) |
| H01R 13/405 | (2006.01) |
| H01R 13/42 | (2006.01) |
| H01R 13/426 | (2006.01) |

(52) U.S. Cl.
CPC ....... *H01R 13/112* (2013.01); *G01R 31/2889* (2013.01); *H01R 13/405* (2013.01); *H01R 13/42* (2013.01); *H01R 13/426* (2013.01)

(58) Field of Classification Search
CPC .... H01R 13/502; H01R 13/11; H01R 13/112; G01R 31/2889
USPC ................................ 439/686, 744, 819, 752
See application file for complete search history.

(56) References Cited

U.S. PATENT DOCUMENTS

| 4,946,407 A | * | 8/1990 | Young | H01R 13/11 29/857 |
| 2004/0185722 A1 | * | 9/2004 | Conrad | H01R 13/112 439/857 |
| 2007/0042649 A1 | * | 2/2007 | Russelburg | H01R 4/185 439/857 |

* cited by examiner

*Primary Examiner* — Abdullah A Riyami
*Assistant Examiner* — Nader J Alhawamdeh
(74) *Attorney, Agent, or Firm* — Maschoff Brennan

(57) ABSTRACT

An electrical contact assembly having a pair of contacts mirroring each other, each contact coupled with an elastomer positioned in a recess formed near a lower end of the contact. Each elastomer has a cylindrical shape with the axis of the cylinder running in a front to rear direction. Each elastomer is secured at its front and rear ends by a lower cavity formed within a housing. The contacts are able to rock sideways around their lower ends between uncompressed and compressed states.

5 Claims, 6 Drawing Sheets

HORIZONTAL CLAMP ELECTRICAL CONTACT ASSEMBLY

FIELD OF INVENTION

The present invention relates to an electrical contact assembly in an integrated circuit testing apparatus, and specifically to one that has a short electrical path and is able to withstand high currents during testing.

BACKGROUND OF INVENTION

Currently, electrical contacts which can be used for both Kelvin/non-Kelvin testing either are not able to handle high electrical currents, or contain many parts that make the assembly difficult to install and repair. One such design is the spring probe, which has a needle shaped design. This type of contact is not able to carry high electrical current due to its design. These spring probes use a micro spring to create a biasing force, and this spring is not able to carry high currents without also creating a high inductance.

Another downside to this and other types of contacts is that the lead pins of the device under test (DUT) have to be very precise during actuation, or test fails might occur. In some automotive integrated circuit (IC) chips, the lead pins are in a needle form. These thin and long lead pins have to engage the contacts usually within a precise area of contact. The lead pins also have to move towards the contacts within a precise axis of travel, that is without being sideways, tilted or offset. Furthermore, if the lead pins are slightly damaged or bent, the likelihood of a test fail is high.

Yet another downside to the known design is that each design can only accommodate one shape of lead pin with a very narrow range of sizes, if any at all.

What is desirable in the art is an electrical contact which can test integrated circuit (IC) devices at high electrical currents, and which is able to receive a larger range of shapes of sizes of lead pin, and lastly also more forgiving should the lead pin be slightly damaged or travels towards the contact in a manner that is not perfectly precise.

SUMMARY OF INVENTION

The present invention seeks to overcome the aforementioned disadvantages by providing an electrical contact assembly having a pair of contacts mirroring each other, each contact coupled with an elastomer positioned in a recess formed near a lower end of the contact. Each elastomer has a cylindrical shape with the axis of the cylinder running in a front to rear direction. Each elastomer is secured at its front and rear ends by a lower cavity formed within a housing. The contacts are able to rock sideways around their lower ends between uncompressed and compressed states. In an uncompressed state, the upper ends of the contacts have a slight gap between them. As a lead pin of a device under test (DUT) is lowered towards the contact, it enters the gap between the contacts' upper ends and pushes them apart. This causes the contacts to rock away from each other, which compresses the elastomers and thus creates a biasing force. In this compressed state, this biasing force translates into a horizontal clamping force acting on the upper ends of the contacts, thereby resulting in a secure electrical contact with the lead pin. In this way, the electrical current flowing through the contact travels across a short path as the connection between the DUT and a bottom terminal in a load board is nearly vertical. This reduces the inductance created during high current testing, which is critical in IC testing.

When the lead pin is moved away from the contact, the pair of contacts rock back so that the upper ends of the contacts move back closer to each other, and the electrical contact assembly moves back to an uncompressed state. A center protrusion acts as a hard stop in between the pair of contacts, and prevents the contacts from rocking all the way toward each other. In other words, the center protrusion maintains the said slight gap between the upper ends of the contacts.

The present invention thus provides an electrical contact assembly for use in a testing apparatus, comprising:
a housing provided with a first slot, a second slot, a center protrusion, a first lower cavity and a second lower cavity, said first slot and second slot each formed by a through-opening running from an upper side to a lower side of said housing, and said first lower cavity and second lower cavity divided at a front end and rear end by a front center wall and a rear center wall, respectively;
a first contact and a second contact arranged such that they mirror each other across a vertical plane, said first contact installed inside said first slot and said second contact installed inside said second slot, and each said contact elongated in a vertical direction and provided with a recess near a lower end; and
a first elastomer and a second elastomer, each said elastomer elongated along a front to rear direction, and partially secured near their center by each said recess, and secured at their front and rear ends by each said lower cavity.

This electrical contact assembly can be in an uncompressed state, a compressed state and the continuum in between both states. In the uncompressed state, upper ends of the contacts are comparatively closer to each other, with only a slight gap between upper ends of the contacts, and the elastomers are comparatively uncompressed. In the compressed state, the upper ends of the contacts are comparatively further from each other, which causes the elastomers to become comparatively compressed between the recesses and the front and rear center walls.

In one preferred embodiment, an upper end of each contact on a side facing the other contact has a convex bulge. This feature allows a larger range of lead pins sizes and shapes to be received by the contact. This also allows a higher tolerance for imprecise lead pin movement towards the contact.

In another preferred embodiment, a lower end of each contact is provided with a curve to allow each contact to rock from side to side.

Other objects and advantages will be more fully apparent from the following disclosure and appended claims.

DETAILED DESCRIPTION OF INVENTION

Figure 1:
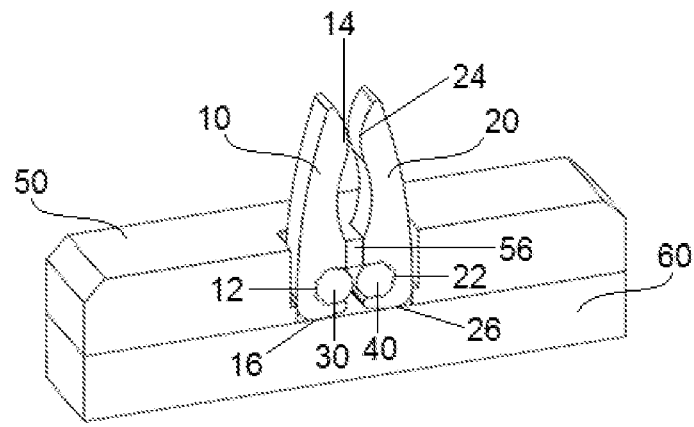
FIG. 1 shows a perspective cross-sectional view of an electrical contact assembly and load board in an embodiment of this invention.
Figure 2:
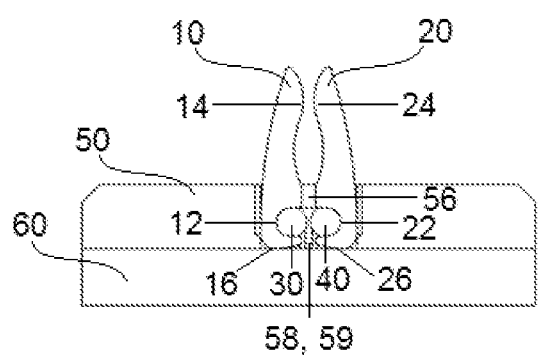
FIG. 2 shows a front cross-sectional view of an electrical contact assembly and load board in an embodiment of this invention.
Figure 3:
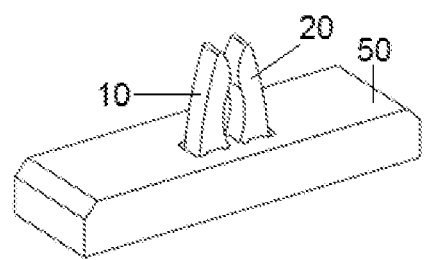
FIG. 3 shows a perspective view of an electrical contact assembly in an embodiment of this invention.
Figure 4:
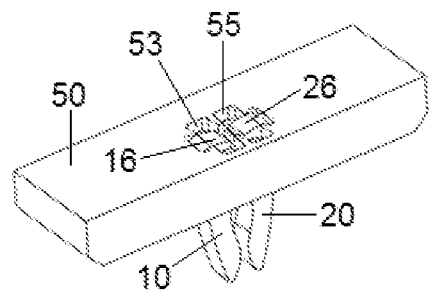
FIG. 4 shows a perspective upside-down view of an electrical contact assembly in an embodiment of this invention.
Figure 5:
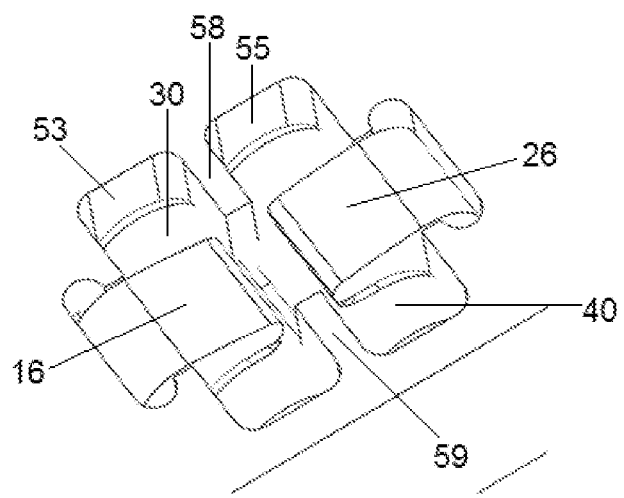
FIG. 5 shows a perspective upside-down close-up view of an electrical contact assembly in an embodiment of this invention.
Figure 6:
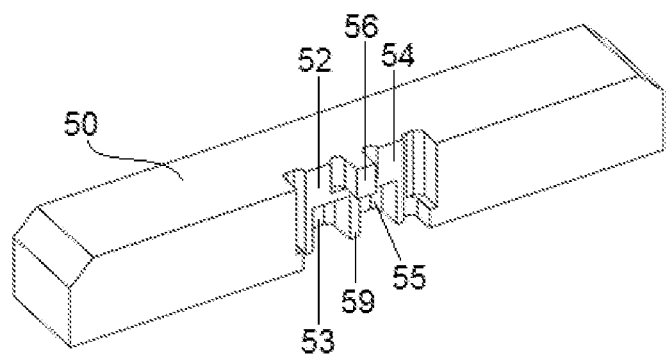
FIG. 6 shows a perspective cross-sectional view of a housing in an embodiment of this invention.
Figure 7:
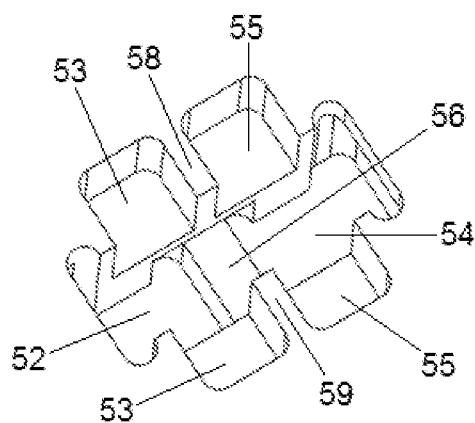
FIG. 7 shows a perspective upside-down close-up view of a housing in an embodiment of this invention.
Figure 8:
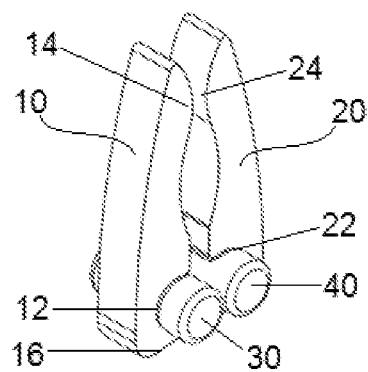
FIG. 8 shows a perspective view of a pair of electrical contacts and elastomers in an embodiment of this invention.
Figure 9:
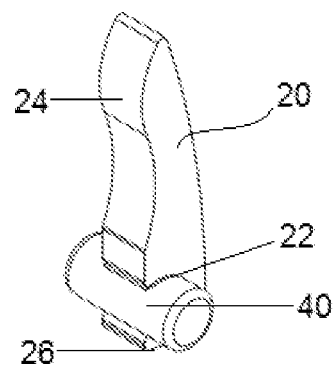
FIG. 9 shows a perspective view of one half of a pair of electrical contacts and elastomers in an embodiment of this invention.
Figure 10:
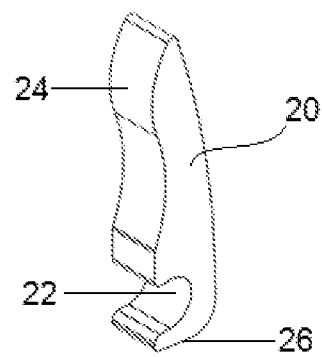
FIG. 10 shows a perspective view of one half of a pair of electrical contacts in an embodiment of this invention.

It should be noted that the following detailed description is directed to an electrical contact assembly of an integrated circuit (IC) testing apparatus, and is not limited to any particular size or configuration but in fact a multitude of sizes and configurations within the general scope of the following description.

LIST OF NUMBERED ELEMENTS IN FIGURES

First Contact (10)
First Contact Recess (12)
First Contact Bulge (14)
First Contact Curve (16)
Second Contact (20)
Second Contact Recess (22)
Second Contact Bulge (24)
Second Contact Curve (26)
First Elastomer (30)
Second Elastomer (40)
Housing (50)
First Slot (52)
First Lower Cavity (53)
Second Slot (54)
Second Lower Cavity (55)
Center Protrusion (56)
Front Center Wall (58)
Rear Center Wall (59)
Load Board (60)
Lead Pin (70)

FIGS. 1 through 10 show various views of an electrical contact assembly, electrical contacts, and housing of this invention. The following description based on FIGS. 1 through 10 will attempt to describe the structure of the electrical contact assembly of this invention.

A housing (50) made from an engineering plastic is provided with two slots, a first slot (52) and a second slot (54), each said slot formed as a through opening running from an upper to a lower side of said housing (50). A center protrusion (56) is provided in between said two slots near an upper end of the housing (50). A first lower cavity (53) is formed near a lower end of the first slot (52), and is essentially an extension of the first slot (52) in the front and rear directions at that lower end. A second lower cavity (55) is formed near a lower end of the second slot (54), and is essentially an extension of the second slot (54) in the front and rear directions at that lower end. The first lower cavity (53) and second lower cavity (55) are separated from each other near their front ends by a front center wall (58), and they are separated from each other near their rear ends by a rear center wall (59).

A pair of contacts comprising a first contact (10) and a second contact (20) is provided. The first contact (10) is positioned in the first slot (52), and the second contact (20) is positioned in the second slot (54). The first contact (10) and second contact (20) are elongated in the vertical direction, and mirror each other across a vertical plane running through the center of the housing (50). Near an upper end of the first contact (10), and on an inner side that is facing the second contact (20), there is provided a first contact bulge (14). This feature allows a larger range of lead pins sizes and shapes to be received by the contact. This also allows a higher tolerance for imprecise lead pin movement towards the contact, while maintaining good electrical contact. Near a lower end of the first contact (10), and also on its said inner side, is provided a first recess (12) that comprises a cavity. Near an upper end of the second contact (20), and on an inner side that is facing the first contact (10), there is provided a second contact bulge (24). This feature allows a larger range of lead pins sizes and shapes to be received by the contact. This also allows a higher tolerance for imprecise lead pin movement towards the contact, while maintaining good electrical contact. Near a lower end of the second contact (20), and also on its said inner side, is provided a second recess (22) that comprises a cavity.

The center protrusion (56) acts as a hard stop in between the pair of contacts (10, 20), and prevents the contacts from rocking all the way toward each other.

The first contact (10) is provided at its lower end with a curve (16). This curve allows the first contact (10) to rock from side to side around its lower end. The second contact (20) is also provided at its lower end with a curve (26). This curve also allows the second contact (20) to rock from side to side around its lower end.

A pair of elastomers comprising a first elastomer (30) and a second elastomer (40), each made of a compressible material that, when compressed, exert a force opposing the compression is provided. Each of these elastomers is elongated in a front to rear direction. In a preferred embodiment, these elastomers are cylindrical in shape, but it they can also take on other shapes. A center portion of the first elastomer (30) is partially enclosed within the first recess (12). Similarly, a center portion of the second elastomer (40) is partially enclosed within the second recess (22). In this embodiment whereby the elastomers have a cylindrical shape, the first and second recesses have circular cavities, in order to ensure a snug fit for the elastomers. If the elastomers were to take on other shapes, the recesses would be appropriately adapted to maintain the snug fit. A front end and rear end of the first elastomer (30) are secured inside the first lower cavity (53). Similarly, a front end and rear end of the second elastomer (40) are secured inside the second lower cavity (55).

Figure 11:
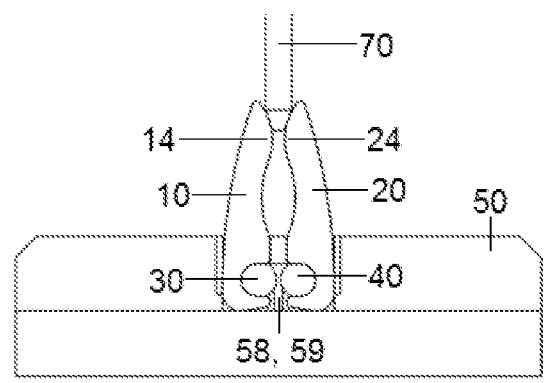
FIG. 11 shows a front cross-sectional view of an electrical contact in an uncompressed state in an embodiment of this invention.
Figure 12:
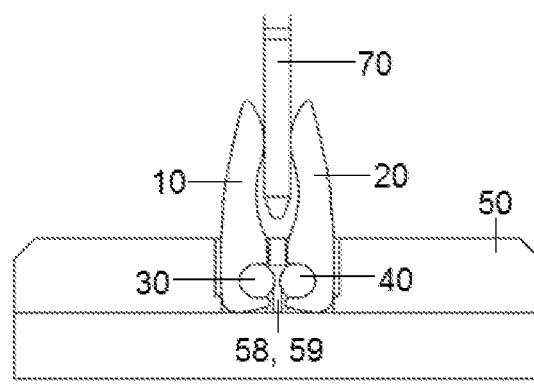
FIG. 12 shows a front cross-sectional view of an electrical contact in a compressed state in an embodiment of this invention.

FIGS. 11 and 12 illustrate the mechanics of the electrical contact assembly of this invention. The following description based on FIGS. 11 and 12 will attempt to describe the way the electrical contact assembly of this invention works during a testing of an IC device.

FIG. 11 shows the electrical contact assembly of this invention just as the lead pin (70) of the device under test (DUT) is about to touch the contacts (10, 20). The electrical contact assembly of this invention is then said to be in an uncompressed state. The lead pin (70) is lowered in between upper ends of the pair of contacts (10, 20). Due to the first contact bulge (14) and second contact bulge (24), as well as the horizontal clamping design of this electrical contact assembly, there is a lot of tolerance for receiving lead pins of differing sizes and shapes, as well as in cases where the lead pin is not lowered precisely in the vertical direction. Once the lead pin (70) reaches the contacts (10, 20), it forces the upper ends of the contacts apart, and the first contact (10) rocks to the left, while the second contact (20) rocks to the right. This rocking causes the first elastomer (30) and second elastomer (40) to become compressed, which in turn exerts a biasing force against the compression. In this compressed state, this biasing force translates into a horizontal clamping force acting on the upper ends of the contacts, thereby resulting in a secure electrical contact with the lead pin. In this way, the electrical current flowing through the contact travels across a short path as the connection between the DUT and a bottom terminal in a load board is nearly vertical. This reduces the inductance created during high current testing, which is critical in IC testing. FIG. 12 shows the electrical contact assembly of this invention in this compressed state.

When the lead pin is moved away from the electrical contact assembly of this invention, the pair of contacts (10, 20) rock back so that the upper ends of the contacts move back closer to each other, and the electrical contact assembly moves back to an uncompressed state. The center protrusion acts as a hard stop in between the pair of contacts (10, 20), and prevents the contacts from rocking all the way toward each other. In this way, the center protrusion maintains a slight gap between the upper ends of the contacts (10, 20) even in the uncompressed state.

While several particularly preferred embodiments of the present invention have been described and illustrated, it should now be apparent to those skilled in the art that various changes and modifications can be made without departing from the scope of the invention. Accordingly, the following claims are intended to embrace such changes, modifications, and areas of application that are within the scope of this invention.

The invention claimed is:

1. An electrical contact assembly for use in an integrated circuit (IC) testing apparatus, comprising:
   a housing provided with a first slot, a second slot, a center protrusion, a first lower cavity and a second lower cavity, said first slot and second slot each formed by a through-opening running from an upper side to a lower side of said housing;
   a first contact and a second contact arranged such that they mirror each other across a vertical plane, said first contact installed inside said first slot and said second contact installed inside said second slot, and each said contact elongated in a vertical direction and provided with a recess near a lower end; and
   a first elastomer and a second elastomer, each said elastomer elongated along a front to rear direction, and partially secured near their center by each said recess, and secured at their front and rear ends by each said lower cavity.

2. The electrical contact assembly for use in an integrated circuit (IC) testing apparatus according to claim 1, further comprising an uncompressed state, in which state upper ends of the said contacts are comparatively closer to each other, and the said elastomers are comparatively uncompressed.

3. The electrical contact assembly for use in an integrated circuit (IC) testing apparatus according to claim 1, further comprising a compressed state, in which state upper ends of the said contacts are comparatively further from each other, which causes the said elastomers to become comparatively compressed.

4. The electrical contact assembly for use in an integrated circuit (IC) testing apparatus according to claim 1, wherein an upper end of each said contact on a side facing the other contact has a convex bulge.

5. The electrical contact assembly for use in an integrated circuit (IC) testing apparatus according to claim 1, wherein a lower end of each said contact is provided with a curve to allow each contact to rock from side to side.

* * * * *